US 11,736,119 B2

(12) United States Patent
Breslow et al.

(10) Patent No.: US 11,736,119 B2
(45) Date of Patent: *Aug. 22, 2023

(54) SEMI-SORTING COMPRESSION WITH ENCODING AND DECODING TABLES

(71) Applicant: Advanced Micro Devices, Inc., Santa Clara, CA (US)

(72) Inventors: Alexander D. Breslow, San Jose, CA (US); Nuwan Jayasena, Cupertino, CA (US); John Kalamatianos, Arlington, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/722,931

(22) Filed: Apr. 18, 2022

(65) Prior Publication Data
US 2022/0239315 A1 Jul. 28, 2022

Related U.S. Application Data (63) Continuation of application No. 16/542,872, filed on Aug. 16, 2019, now Pat. No. 11,309,911.

(51) Int. Cl.
*H03M 7/40* (2006.01)
*G06F 3/06* (2006.01)
(Continued)

(52) U.S. Cl.
CPC ........ *H03M 7/4037* (2013.01); *G06F 3/0608* (2013.01); *G06F 3/0661* (2013.01); *G06F 3/0673* (2013.01); *G06F 7/08* (2013.01)

(58) Field of Classification Search
CPC .. H03M 7/4037; G06F 3/0608; G06F 3/0611; G06F 3/0673; G06F 7/08
(Continued)

(56) References Cited

U.S. PATENT DOCUMENTS 5,442,630 A * 8/1995 Gagliardi ............ H04L 12/4612
370/473
5,704,060 A 12/1997 Del Monte
(Continued)

FOREIGN PATENT DOCUMENTS

GB 2531005 A 4/2016

OTHER PUBLICATIONS

International Search Report and Written Opinion for International Application No. PCT/US2020/045903, dated Nov. 23, 2020, 8 pages.

*Primary Examiner* — Arpan P. Savla
*Assistant Examiner* — Sidney Li
(74) *Attorney, Agent, or Firm* — Polansky & Associates, P.L.L.C.; Paul J. Polansky; Nathan H. Calvert (57) ABSTRACT

A data processing platform, method, and program product perform compression and decompression of a set of data items. Suffix data and a prefix are selected for each respective data item in the set of data items based on data content of the respective data item. The set of data items is sorted based on the prefixes. The prefixes are encoded by querying multiple encoding tables to create a code word containing compressed information representing values of all prefixes for the set of data items. The code word and suffix data for each of the data items are stored in memory. The code word is decompressed to recover the prefixes. The recovered prefixes are paired with their respective suffix data.

20 Claims, 10 Drawing Sheets

(51) Int. Cl.
*G06F 7/08* (2006.01)
*G06F 7/00* (2006.01)

(58) Field of Classification Search
USPC .......................................................... 711/154
See application file for complete search history.

(56) References Cited

U.S. PATENT DOCUMENTS

| | | |
|---|---|---|
| 6,121,903 A | 9/2000 | Kalkstein |
| 6,650,259 B1 | 11/2003 | Cooper |
| 8,606,772 B1 | 12/2013 | Xu et al. |
| 10,613,791 B2 | 4/2020 | Meister et al. |
| 11,309,911 B2 * | 4/2022 | Breslow ................ G06F 3/0673 |
| 2002/0057213 A1 | 5/2002 | Heath |
| 2006/0153239 A1 | 7/2006 | Julian et al. |
| 2008/0189545 A1 | 8/2008 | Parkinson |
| 2008/0317364 A1 | 12/2008 | Gou et al. |
| 2009/0174583 A1 | 7/2009 | Diaz-Gutierrez et al. |
| 2011/0158323 A1 * | 6/2011 | Chen ....................... H03M 7/40 |
| | | 375/240 |
| 2012/0110025 A1 | 5/2012 | Reznik |
| 2015/0178305 A1 | 6/2015 | Mueller et al. |
| 2016/0112062 A1 | 4/2016 | Dal Ton et al. |
| 2017/0237995 A1 | 8/2017 | Lou et al. |
| 2018/0356989 A1 | 12/2018 | Meister et al. |

* cited by examiner

| Prefixes (ordered from right to left) | Output ($\sigma$) |
|---|---|
| 0,0,0,0 | $0 = \binom{0+3}{3+1} + \binom{0+2}{2+1} + \binom{0+1}{1+1} + \binom{0+0}{0+1} = 0+0+0+0$ |
| 1,0,0,0 | $1 = \binom{1+3}{4} + \binom{0+2}{3} + \binom{0+1}{2} + \binom{0+0}{1} = 1+0+0+0$ |
| 1,1,0,0 | $2 = \binom{1+3}{4} + \binom{0+2}{3} + \binom{0+1}{2} + \binom{0+0}{1} = 1+1+0+0$ |
| 1,1,1,0 | $3 = \binom{1+3}{4} + \binom{1+2}{3} + \binom{1+1}{2} + \binom{0+0}{1} = 1+1+1+0$ |
| 1,1,1,1 | $4 = \binom{1+3}{4} + \binom{1+2}{3} + \binom{1+1}{2} + \binom{1+0}{1} = 1+1+1+1$ |
| 2,0,0,0 | $5 = \binom{2+3}{3+1} + \binom{0+2}{2+1} + \binom{0+1}{1+1} + \binom{0+0}{0+1} = 5+0+0+0$ |
| 2,1,0,0 | $6 = \binom{2+3}{4} + \binom{1+2}{3} + \binom{0+1}{2} + \binom{0+0}{1} = 5+1+0+0$ |
| 2,1,1,0 | $7 = \binom{2+3}{4} + \binom{1+2}{3} + \binom{1+1}{2} + \binom{0+0}{1} = 5+1+1+0$ |
| 2,1,1,1 | $8 = \binom{2+3}{4} + \binom{1+2}{3} + \binom{1+1}{2} + \binom{1+0}{1} = 5+1+1+1$ |
| 2,2,0,0 | $9 = \binom{2+3}{4} + \binom{2+2}{3} + \binom{0+1}{2} + \binom{0+0}{1} = 5+4+0+0$ |
| 2,2,1,0 | $10 = \binom{2+3}{4} + \binom{2+2}{3} + \binom{1+1}{2} + \binom{0+0}{1} = 5+4+1+0$ |
| 2,2,1,1 | $11 = \binom{2+3}{4} + \binom{2+2}{3} + \binom{1+1}{2} + \binom{1+0}{1} = 5+4+1+1$ |
| 2,2,2,0 | $12 = \binom{2+3}{4} + \binom{2+2}{3} + \binom{2+1}{2} + \binom{0+0}{1} = 5+4+3+0$ |
| 2,2,2,1 | $13 = \binom{2+3}{4} + \binom{2+2}{3} + \binom{2+1}{2} + \binom{1+0}{1} = 5+4+3+1$ |
| 2,2,2,2 | $14 = \binom{2+3}{4} + \binom{2+2}{3} + \binom{2+1}{2} + \binom{2+0}{1} = 5+4+3+2$ |

SEMI-SORTING COMPRESSION WITH ENCODING AND DECODING TABLES

This application is a continuation of U.S. patent application Ser. No. 16/542,872 filed Aug. 16, 2019, entitled "Semi-Sorting Compression With Encoding and Decoding Tables".

BACKGROUND

Semi-sorting has been described for its use in compressing fingerprints in cuckoo filters and d-left counting Bloom filters, two important approximate set membership data structures (ASMDSs) that are prevalent in networking hardware and software, among other applications (e.g., database systems, genome sequencing, and filesystems). A fingerprint is a short hash that encodes the presence of an item in the set that ASMDS approximately represents. Typically, fingerprints are stored in buckets (akin to cache sets) within the ASMDS, where the position of the fingerprint within the bucket does not change its meaning.

Prior work orders these fingerprints by their prefix and replaces the prefixes with a code word. To encode and decode fingerprints, prior work uses a pair of encoding and decoding tables. However, the rate of growth of the size of these tables relative to the associativity practically limits the associativity of a bucket to four or less because at an associativity of four, the lookup tables can be several kilobytes in size. Thus, a solution which reduces the size of these tables to improve their storage in hardware caches or other memory would be desirable.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data processing platform includes a memory and a processor coupled to the memory which is capable of performing compression and decompression of a set of data items. The processor receives a set of data items and selects suffix data and a prefix for each respective data item in the set of data items based on data content of the respective data item. The set of data items is sorted based on the prefixes. The prefixes are encoded by querying multiple encoding tables to create a code word containing compressed information representing values of all prefixes for the set of data items. The suffix data for each of the data items and the code word are stored in the memory. The code word is decompressed to recover the prefixes, and the recovered prefixes are paired with their respective suffix data.

A method compresses and stores data items. A set of data items is received, and suffix data and a prefix are selected for each respective data item in the set of data items based on data content of the respective data item. The set of data items is sorted based on the prefixes. The prefixes are encoded by querying multiple encoding tables to create a code word containing compressed information representing values of all prefixes for the set of data items. The code word and the suffix data for each of the data items are stored. The code word is decompressed to recover the prefixes. The recovered prefixes are paired with their respective suffix data.

A tangible nontransitory computer readable medium holds a program product executable by at least one processor to compress and decompress data items. A set of data items is received, and suffix data and a prefix are selected for each respective data item in the set of data items based on data content of the respective data item. The set of data items is sorted based on the prefixes. The prefixes are encoded by querying multiple encoding tables to create a code word containing compressed information representing values of all prefixes for the set of data items. The code word and the suffix data for each of the data items are stored in memory. The code word is decompressed to recover the prefixes. The recovered prefixes are paired with their respective suffix data.

Figure 1:
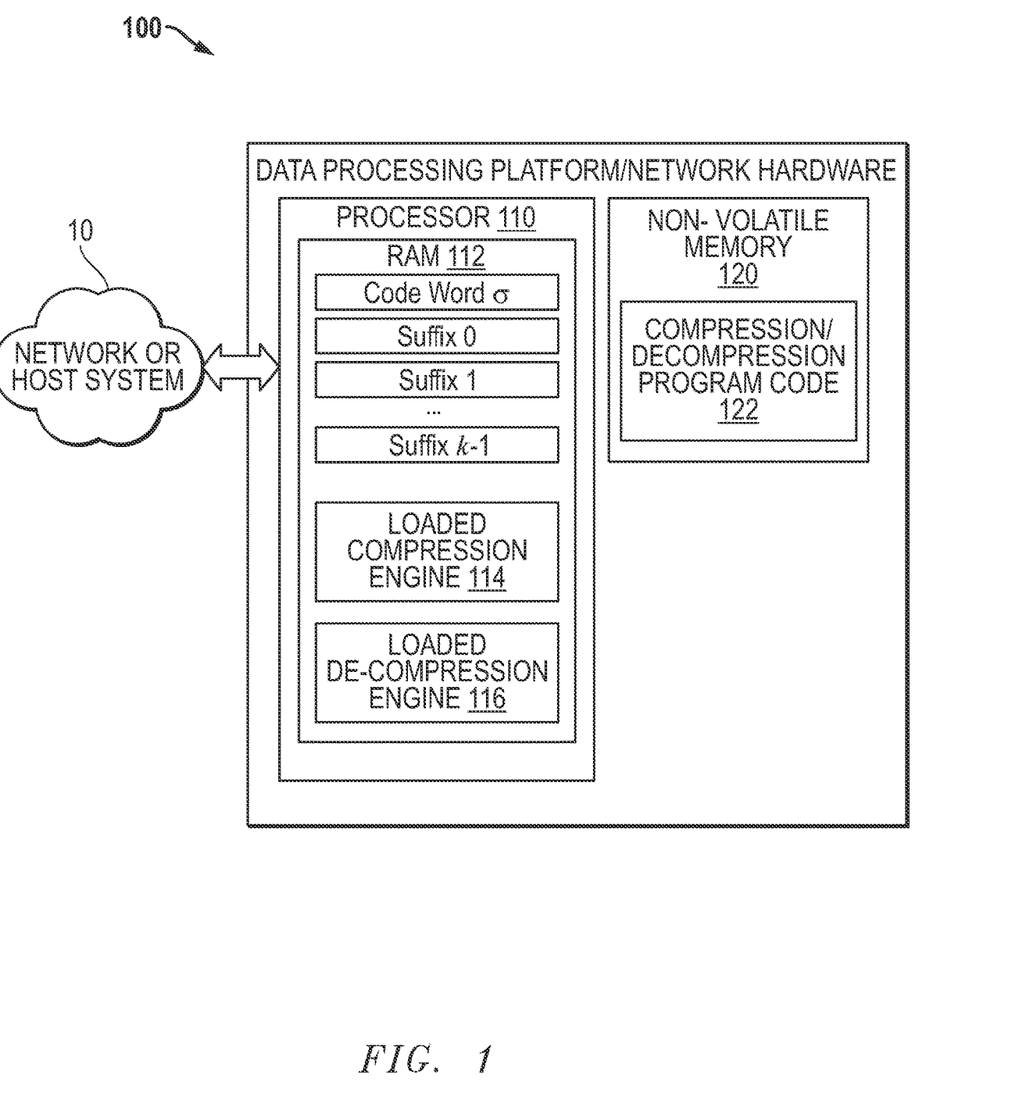
FIG. 1 illustrates in block diagram form a data processing platform including compression according to some embodiments.

FIG. 1 illustrates in block diagram form a data processing platform including compression according to some embodiments. Data processing platform 100 may be any platform with a need for compressing a set of data items with high entropy that may be reordered. For example, the techniques herein have many applications like compression of software and hardware cache tags and fingerprints in approximate set membership data structures. Generally, data processing platform 100 provides compression and decompression for a set of fixed-length items. The techniques are most beneficial with uniformly random items (i.e., with maximum informational entropy) whose order can be permuted. Application may vary from networking, software systems, and hardware caches.

Data processing platform 100 communicates with a network or host system 10 to fulfill requests for data storage and retrieval, or perform operations such as encryption key retrieval or caching for a host system. Data processing platform 100, in this example, includes a processor 110 in communication with random-access memory (RAM) 112, which may be internal or external to processor 110. RAM 112 may be part of an integrated cache of processor 110 or in the platform 100's main memory, for example. Processor 110 is also in communication with a non-volatile memory 120, which provides a tangible, non-transitory computer readable medium, such as Flash memory or a hard drive, that holds computer program code such as compression and decompression program code 122.

RAM 112 holds data used in the compression techniques described below, such as a code word σ, and suffix 0 to suffix k−1 (there are a number k of suffixes, each of which is associated with one of the k data items). Such data may also be stored in non-volatile memory. When program code 122 is loaded from non-volatile memory 120, compression and decompression program code are present in RAM 112 as depicted by the loaded compression engine 114 and loaded decompression engine 116. Other data used with the techniques described herein, such as the data items to be compressed and encoding tables may also be held in RAM 112 or non-volatile memory 120.

While in this embodiment, data processing platform includes a processor 110 which executes program code instructions, other embodiments may implement some or all of the compression features in hardware such as digital logic in networking ASICs, CPUs, GPUs, or programmable logic in FPGAs.

Figure 2:
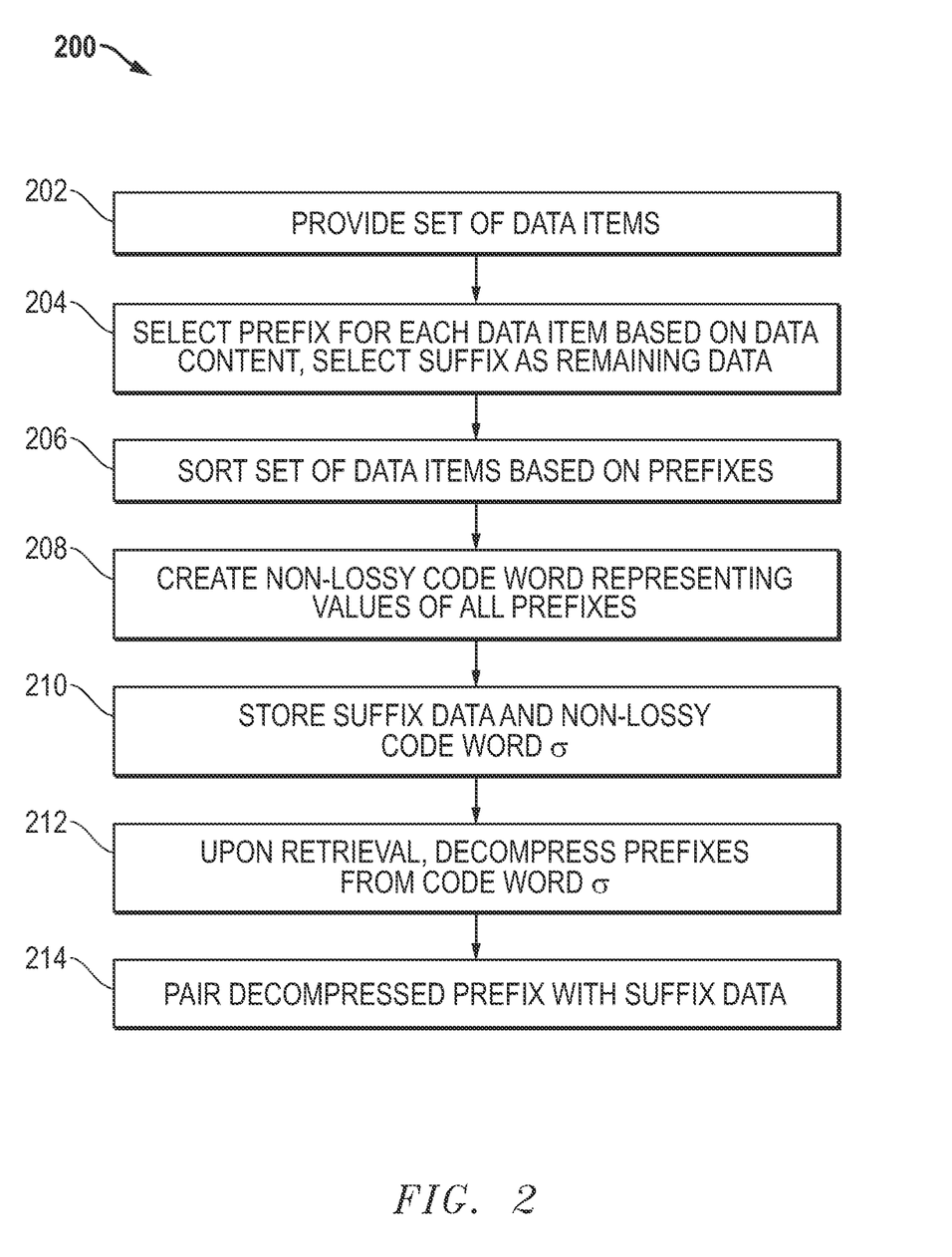
FIG. 2 illustrates in flow diagram form a process for compressing and decompressing data according to some embodiments.

FIG. 2 illustrates in flow diagram form a process 200 for compressing and decompressing data according to some embodiments. A set of data items is provided for compression at block 202. The data items are typically fixed-length items, often have a high entropy as discussed above. Some subsequences of bits in the data items may have a high entropy, while other subsequences may be less random. For example, various types of cache lines, cache tags, fingerprints from ASMDSs, network routing data, hardware tables from branch predictors or hardware prefetchers, or database entries, to name some examples.

At block 204, process 200 selects a prefix and suffix data for each data item in the set based on the item's data content. In some embodiments, the data items may already have identified prefixes and suffixes, in which case block 204 is not necessary. For example, the set of data items may be a set of cache lines with cache tags already provided, of which a portion or the full tag are used as a prefix. When selecting a prefix, process 200 preferably selects a deterministic subsequence of bits from each item, such as a number of initial bits from the item. The subsequence may be selected from any desired part of the data item and may include non-sequential bits from the data item such as a fingerprint or hash that is computed from non-contiguous bit subsequences from the data item. Alternatively, a hash or computation on the desired part of the data item is used in certain implementations to select out or to produce a prefix. The suffix data is typically the bits remaining in the data item excluding the prefix.

Next, at block 206, the data items are sorted based on the prefixes. The sorting may be done on the entire set of data items, or the set may be split into subsets and the subsets sorted. In some implementations, data items are stored in order subject to an ordering of the prefixes and for these embodiments, block 206 need not be executed. Then at block 208, a code word representing compressed values of all the prefixes in the set is created, as further described below. The code word is created based on the sorted set. The code word may be non-lossy, that is, able to reproduce every bit of the compressed prefixes. If multiple subsets are sorted, a code word is typically created for each subset.

At block 210, the suffix data and the code word are stored in memory. Depending on the application, the memory used for storage may be short term RAM such as RAM 112 (FIG. 1) or storage memory such as non-volatile memory 120 (FIG. 1). The suffix data and code word may also be stored in a database or networked storage that is not part of the data processing platform performing the compression and decompression.

When information from the data set is requested, the stored suffix data and code word are retrieved, and the prefixes are decompressed at block 212. An example of one suitable decompression process is described below. The decompressed prefixes are then paired with the prefix data to provide the complete data items. In some cases, the complete code word does not need to be decompressed, if the desired data items are extracted early in the decompression process, as further described below.

Figure 3:
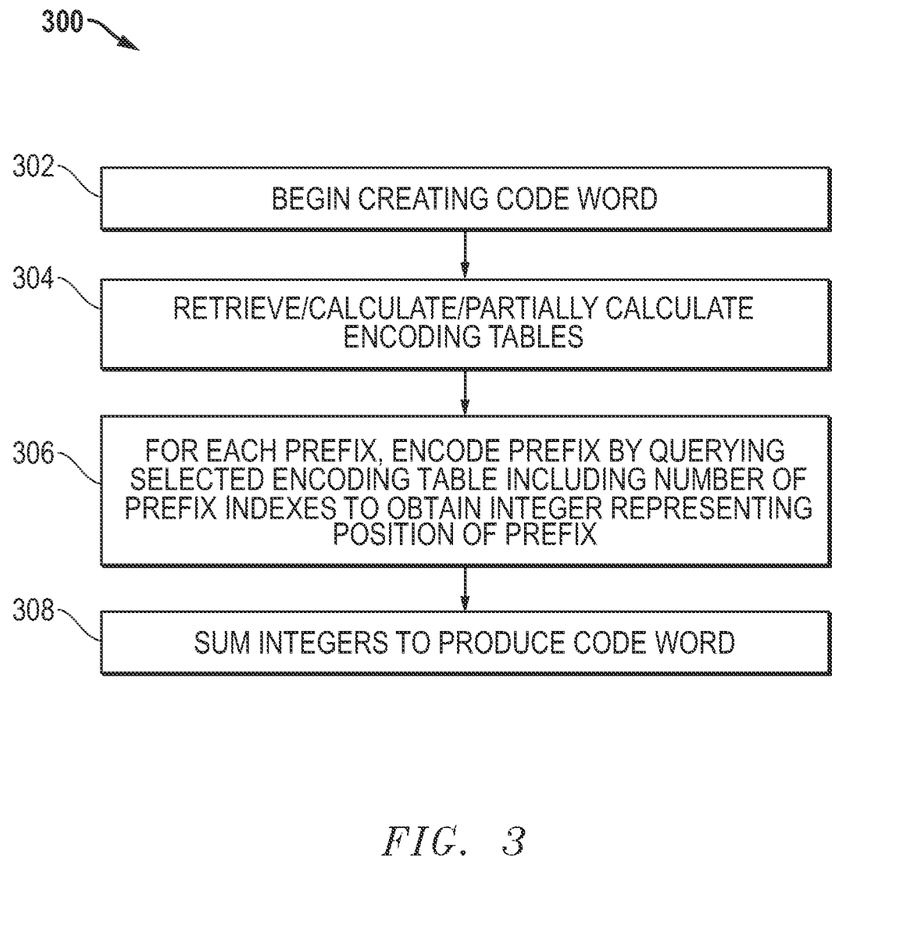
FIG. 3 illustrates in flow diagram form a more detailed process for creating a code word containing compressed data according to some embodiments.
Figure 4:
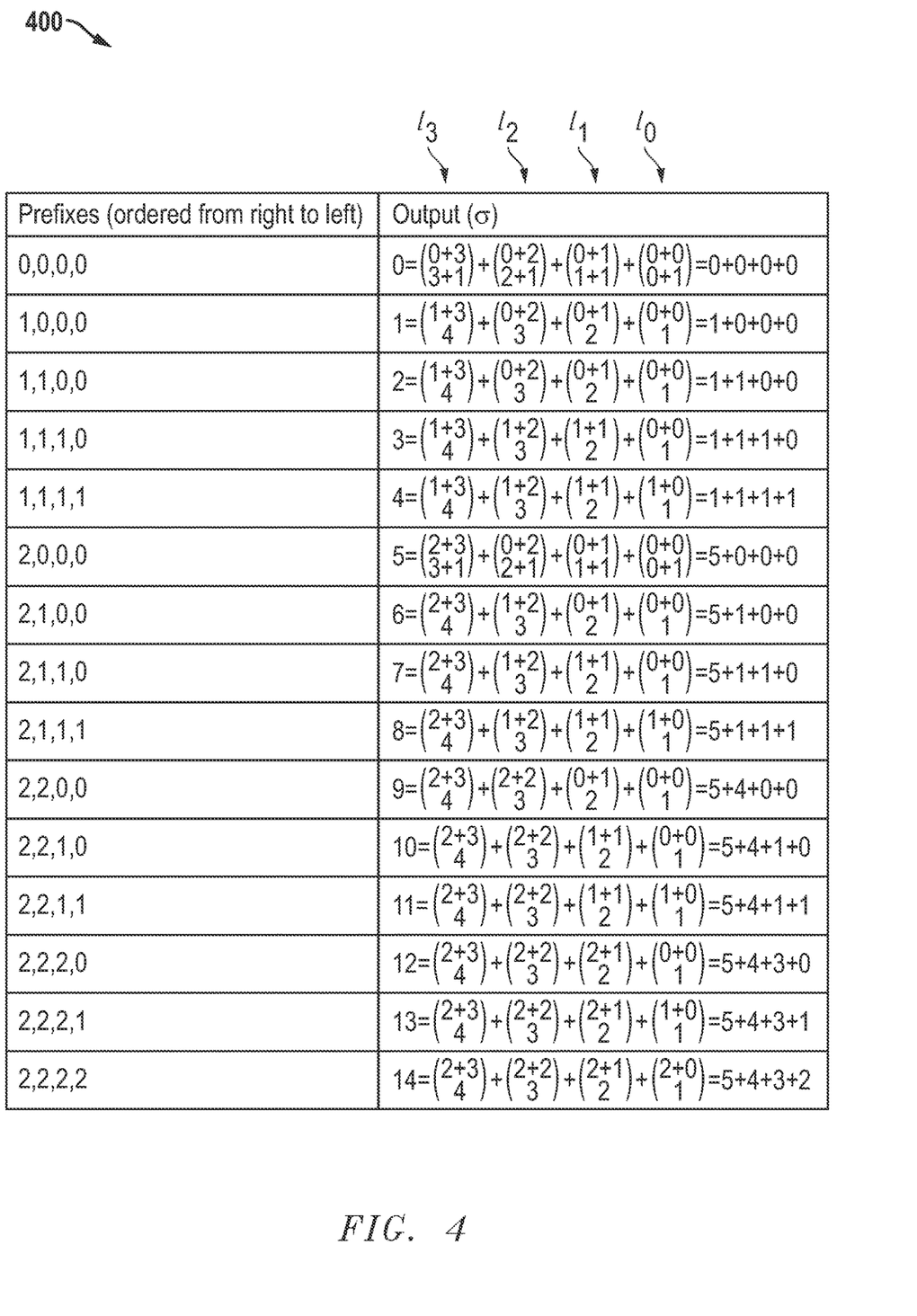
FIG. 4 illustrates in table form a process for using encoding tables to create a code word containing compressed data according to some embodiments.
Figure 5:
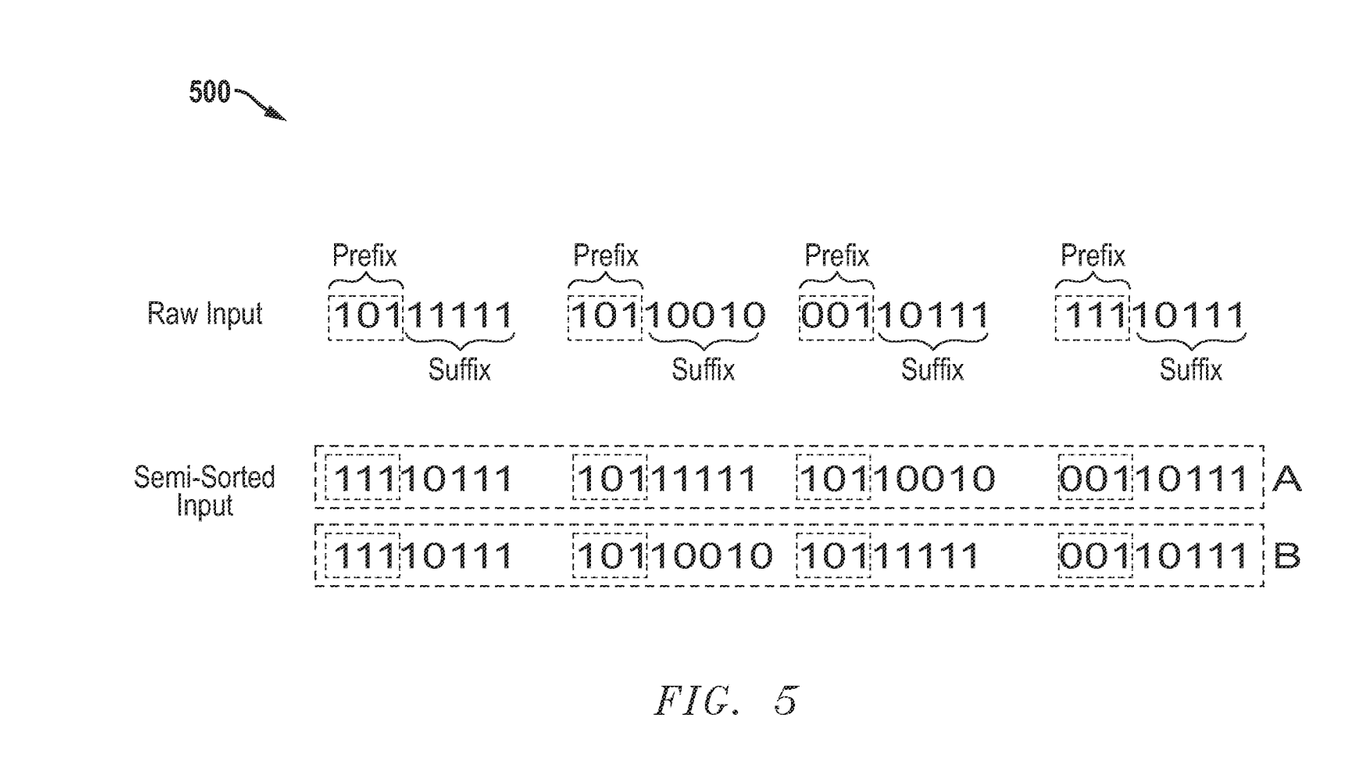
FIG. 5 is a diagram showing a semi-sorting process according to some embodiments.
Figure 6:
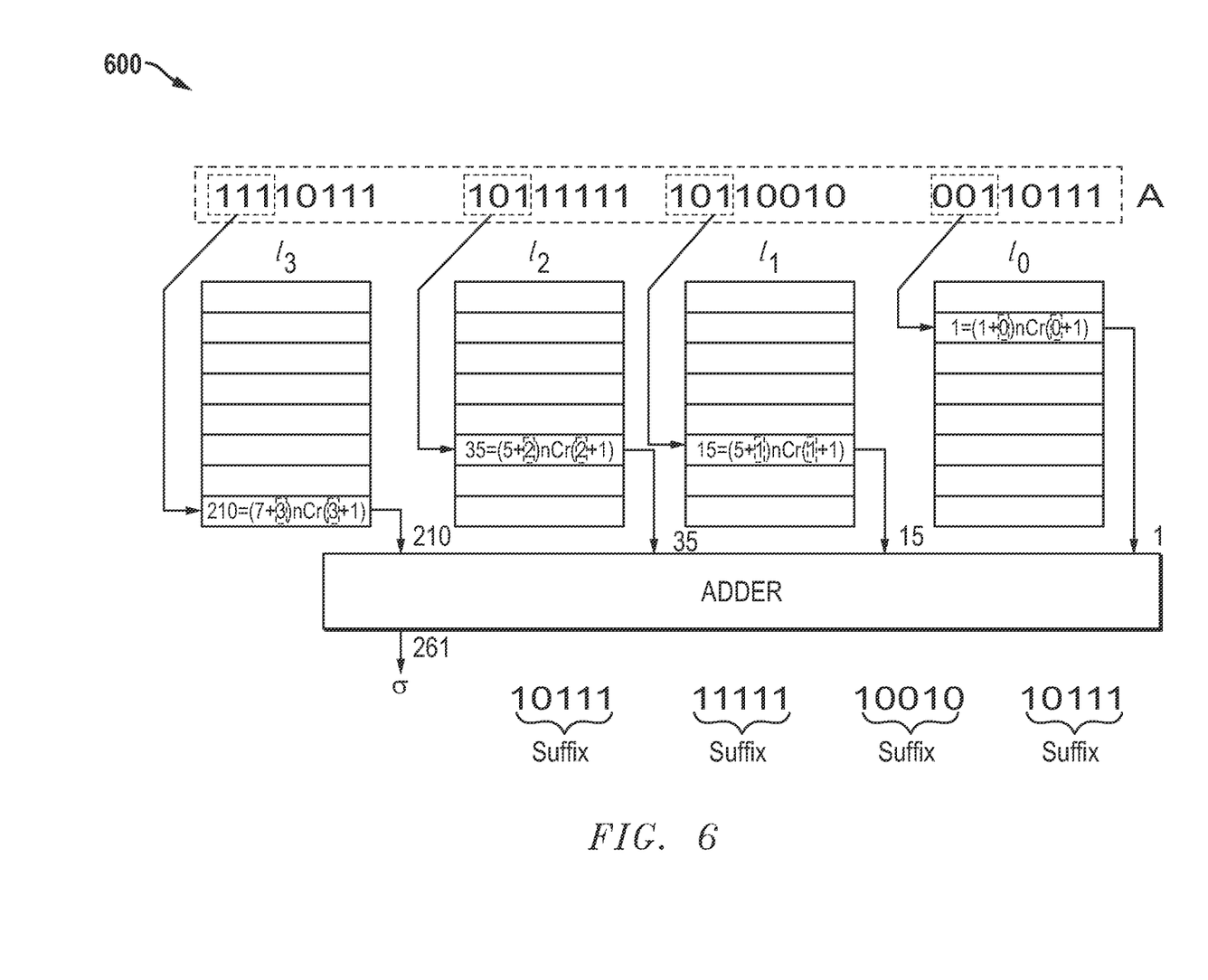
FIG. 6 is a diagram showing an example of using encoding tables to create a code word according to some embodiments.

FIG. 3 illustrates in flow diagram form a more detailed process 300 for creating a code word containing compressed data according to some embodiments. Further examples of compression processes are illustrated in FIGS. 4-6. These processes may be performed by a software compression engine such as compression engine 114 of FIG. 1, or by other suitable combinations of hardware and software.

Process 300 begins creating a code word at block 302. Block 304 provides the encoding tables needed to create the code word by either retrieving them from memory, calculating them, or partially calculating them, as further described below.

For each prefix, in the order provided by sorting, block 306 encodes the prefixes by querying multiple encoding tables to create a code word a containing compressed information representing values of all prefixes for the set of data items. In this embodiment, block 306 queries the encoding tables to obtain a plurality of integers representing respective prefix positions in the encoding tables.

As depicted in FIG. 5, the process may work with variation in the sorting results, as long as the data items are ordered via their prefix values. The results of querying the multiple input tables are used to create the code word a at block 308, in this embodiment by summing the resulting integers as shown. FIG. 5 shows the raw input of a set of data items with the prefixes and suffixes identified. The depicted data items are merely one example with a small number of small data items for simplicity, and many other arrangements of data items may be stored according to the techniques herein. These data items are sorted as set forth at block 206 (FIG. 2). This sort constitutes a semi-sort with respect to the data items because the suffix data is not used in the sort, only the prefix data. The results of the sort may therefore vary in order, as shown by the sort output A and B of FIG. 5, which are both valid results of a prefix-based sort on the data items. Notice that the two data items that share the same prefix (101) appear in swapped positions in A and B. More generally, data items with the same prefix may appear in any order in the output of the sort among one another without affecting the output's correctness. Process 300 is effective despite possible variations in the order of the input data such as those in FIG. 5.

Referring again to FIG. 3, while the blocks are depicted as sequential, the actual order depends on the implementation. When performed by a processor, the process may iterate through each prefix and add the integer value to a running total in each iteration. A more parallel implementation may perform encoding table lookups in parallel. When all the integers are summed at block 308, the completed sum provides the code word σ.

FIG. 4 illustrates in table form a process for using encoding tables to create a code word containing compressed data according to some embodiments. The compression encoding takes an ordered list of k, r-bit prefixes and outputs a codeword that expresses them. Integer k represents the number of data items in the set, and r represents the number of bits in each prefix. One such encoding scheme is depicted, which uses a variant of the combinatorial expression $$\binom{2^r + k - 1}{k}$$

to enumerate the encodings. The scheme uses an iterator i that enumerates through the data items in a set 0, 1, 2, ..., k−2, k−1. As it enumerates, it plugs in the value of the prefix for the ith data item (referred to as $p_i$) in lieu of $2^r$ and i+1 in lieu of k (would be i in lieu of k were it not for zero indexing). It then sums over these partial expressions to produce a net sum. The formula for the code word a that encodes the k prefixes in this embodiment is given by equation 1:

$$\sigma = \sum_{i=0}^{k-1} \binom{p_i + i}{i + 1} \quad (1)$$

The depicted table 400 shows an example of an application of this formula that follows for k=4 and r=log₂(3). In this example, the process takes 4 data item prefixes and reduces their storage cost from 4 log₂ (3)≈6.34 bits to log₂ (15)≈3.91 bits. This encoding can be done by accessing one or more precomputed tables, by computing the closed form expressions in response to a compression or decompression request requiring the computed values, or by a combination thereof. Yet another alternative is to only compute values or partial values as they are needed but cache the values after they are computed in an associated data or hardware structure for later use. It is also possible to reduce the multiplication calculations involved in the computation down to a series of equivalent additions, shift, and masking operations.

For versions that use precomputed encoding lookup tables, it is preferred to use a separate lookup table for each data item in the set (excluding the $0^{th}$ data item where the encoding is the identity function). From table 400, four encoding tables $l_0$ through $l_3$ are created holding the values for the combinatorial expressions shown in each of the four columns. These same tables can then also be used for decoding as further described below.

Figure 10:
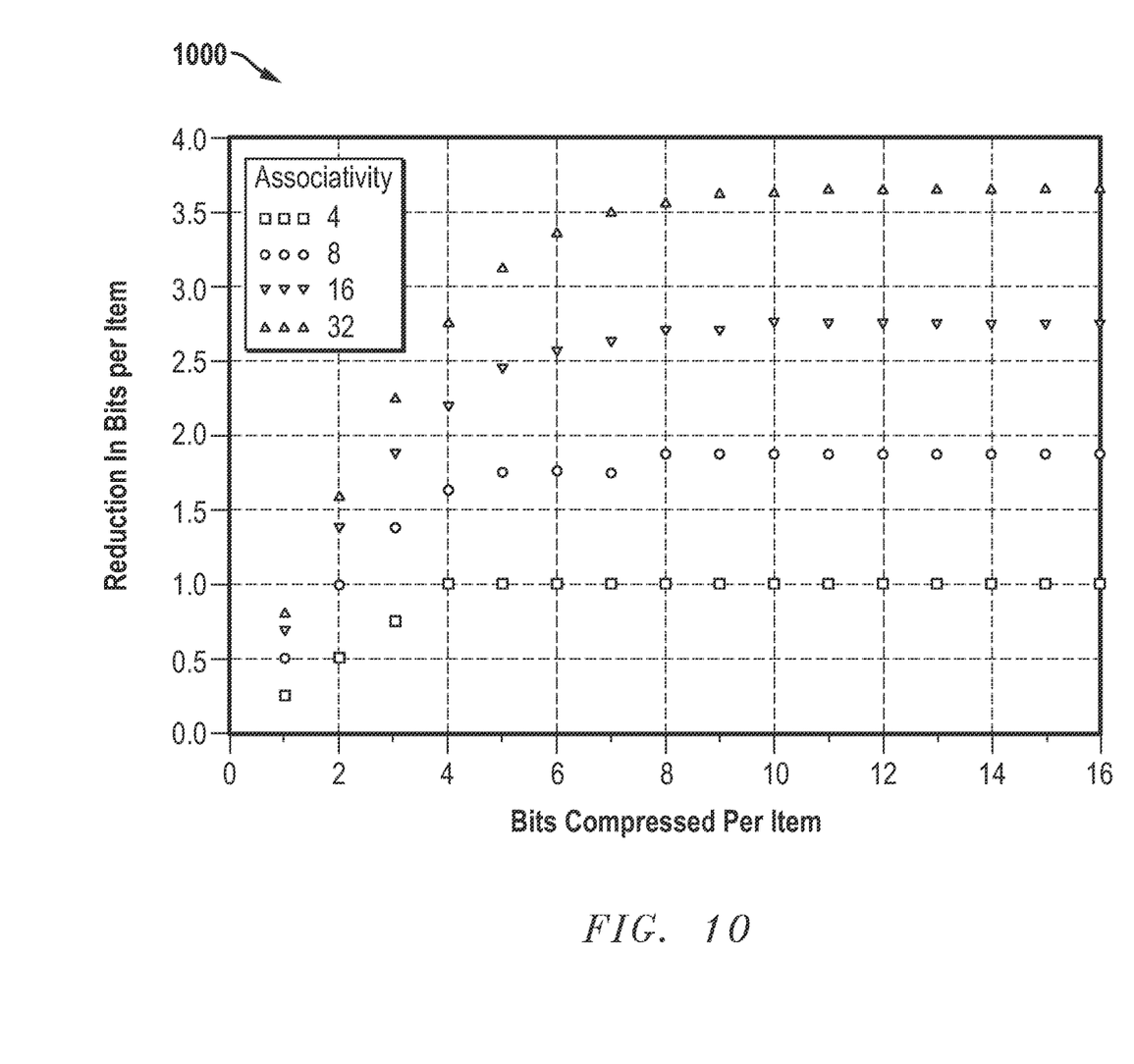
FIG. 10 illustrates in chart form an example of compression performance obtained according to some exemplary embodiments.

In this embodiment, the number of tables is equal to the number of prefixes k. In other embodiments, fewer tables may be used. For example, it is possible to use implicit encoding to implement table $l_0$, as further discussed below with respect to FIG. 10. The tables are generally referred to as tables $l_0$ through $l_{k-1}$, where each $l_i$ is the encoding table for the ith data item's prefix $p_i$. Each $l_i$ holds $2^r$ entries and is indexed into by the specific $p_i$, which yields the specific encoding. Specifically, $$l_i[p_i] = \binom{p_i + i}{i + 1}$$

for all integral values of i where 0≤i≤k−1 and all integral values of $p_i$ where 0≤$p_i$≤$2^r$−1. In this embodiment, index values representing the prefix position within the table are used to encode the prefixes. In other embodiments, other values may be used. For example, the indexed values may appear in a different order in the table from that depicted, in which case the index returned is not necessarily a prefix position.

Various techniques may be used to increase the efficiency of computing or storing the encoding tables. The encoding tables could be partially computed on the fly to reduce their storage cost. For instance, every multiply by 2 may be implemented as a shift operation, so it is more efficient to store a count of such shifts rather than the shifted values. When providing the encoding tables $l_0$ to $l_{k-1}$, if two entries within an encoding table store the same value, the process may merge the two entries into a single entry. For example, by choosing appropriate values for r and k, the process may leverage the property that $$\binom{p_i + i}{i + 1} = \binom{p_i + i}{p_i - 1},$$

or a similar property for other encoding schemes, to reduce the number of entries per table that need to be stored (e.g., $p_i$=5 and i=2, then $$\binom{5 + 2}{2 + 1} = \binom{5 + 2}{5 - 1},$$

as both are 35). In that case, the process may replace the individual $l_i$'s with a single matrix that is indexed by the tuple $p_i$ and i, which does not store duplicate values for when i+1 is equal to $p_i$−1 (e.g., the process does not store both $$\binom{7}{3} \text{ and } \binom{7}{4}).$$

In some implementations, the encoding tables may be no more than a kilobyte in size for common values of r and k. The process need only store on the order of $2^r$k entries, so values of r in the range of about 4 to 8 may be employed while still providing the majority of the space savings and with a small area overhead for the encoding tables. The reduction in storage requirements for an exemplary embodiment in this range of r values can be seen below in FIG. 10.

The sequence of FIG. 5 and FIG. 6 illustrate an example compression process using 8-bit data items, and employing 3-bit prefixes. FIG. 5 illustrates in diagram form results 500 of a semi-sorting process according to some embodiments. Depicted are four raw input data items to the process, each with 8 bits. The 3-bit prefixes and the remaining 5-bit suffixes are identified. Two valid variations of the semi-sorted output (the output of block 206, FIG. 2, for example) are shown labelled A and B. As can be seen, two data items in the set have a prefix value of 101. Because the sort rearranges data items subject to the relative ordering of their respective prefixes, the two depicted data items with prefix 101 may be interchanged with one another in the sorted output without affecting correctness.

FIG. 6 illustrates in diagram form an exemplary process 600 of using encoding tables to create a code word according to some embodiments. The depicted scenario uses the set of data items from FIG. 5, sorted according to output A. The encoding process generally starts with of k, r-bit prefixes, and encodes the prefixes to produce the code word σ that is the compressed representation of the prefixes. In this scenario, k is four, and process 600 uses four encoding tables $l_3$ to $l_0$. The encoding tables may be produced according to the techniques described with respect to FIG. 4, or with other suitable techniques. The diagram shows an arrow from each prefix value to a table entry in the respective encoding table for the prefix, indicating the prefix value is used as an index into the table. The function "nCr" indicates the combinatorial expression "n choose k," the number of ways to choose k items from a group of n items if order does not matter. An integer value results at each respective entry, as described with respect to FIG. 3, block 306. The arrows out of the table entry to the adder block represent that the integer values are summed to produce the code word σ, in this example having a value of 261. This code word value is stored in memory along with the 5-bit suffix values.

In some embodiments, the encoding tables are provided such that, for each prefix, the respective prefix index provides a count based on a plurality of ordered collections of prefix values ordered by an ordering property, with the counts based on the prefix's relative position in the ordered collections. The count for each respective prefix index indicates a number of ordered collections of prefix values where each ordered collection's size is the output of a function applied to the prefix values' relative position in the ordered collections, and all prefix values in the ordered collections are less than the value of the respective prefix as computed by the ordering property. For example, in the embodiment of FIG. 6, when examining the ith prefix, where $0 \le i < k$, the ith prefix's encoding is retrieved by performing a table lookup on $l_i[\text{prefix}]$. The index value returned is a count of the number of length i+1 sorted lists of prefixes that numerically precede the first list containing ith prefix. For instance, if i is 3 and the prefix is 2, $l_3[2]$ stores the count of the number of length 3+1 lists ordered in nonincreasing order that precede the list 2, 0, 0, 0. These are (1, 1, 1, 1), (1, 1, 1, 0), (1, 1, 0, 0), (1, 0, 0, 0), and (0, 0, 0, 0), which is 5 in total. While in this implementation, the ordering property employed with the ordered collections is nonincreasing, any suitable ordering property that places prefix values in a defined order may be used.

Figure 7:
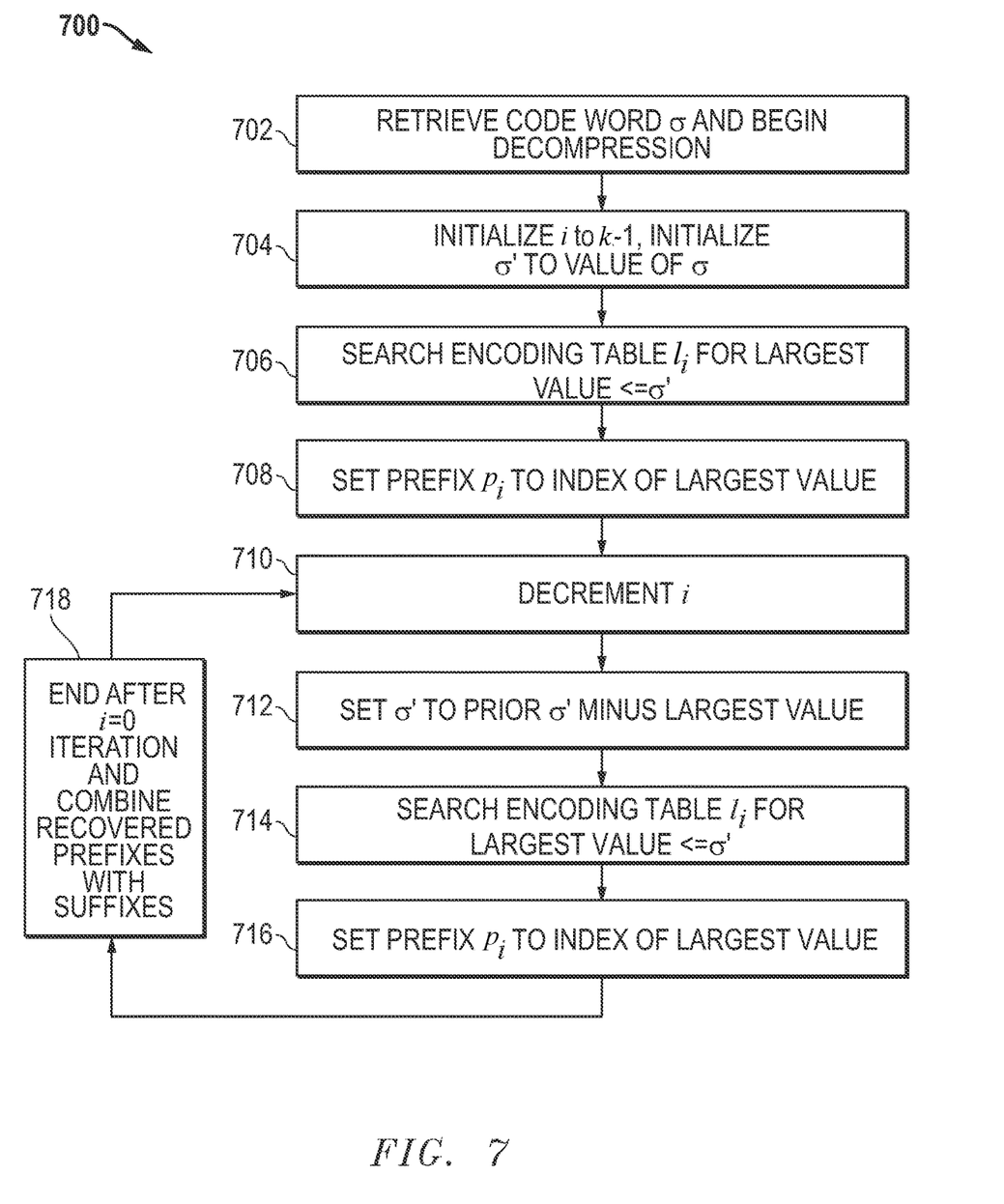
FIG. 7 illustrates in flow diagram form a process for decompressing a code word according to some embodiments.
Figure 8:
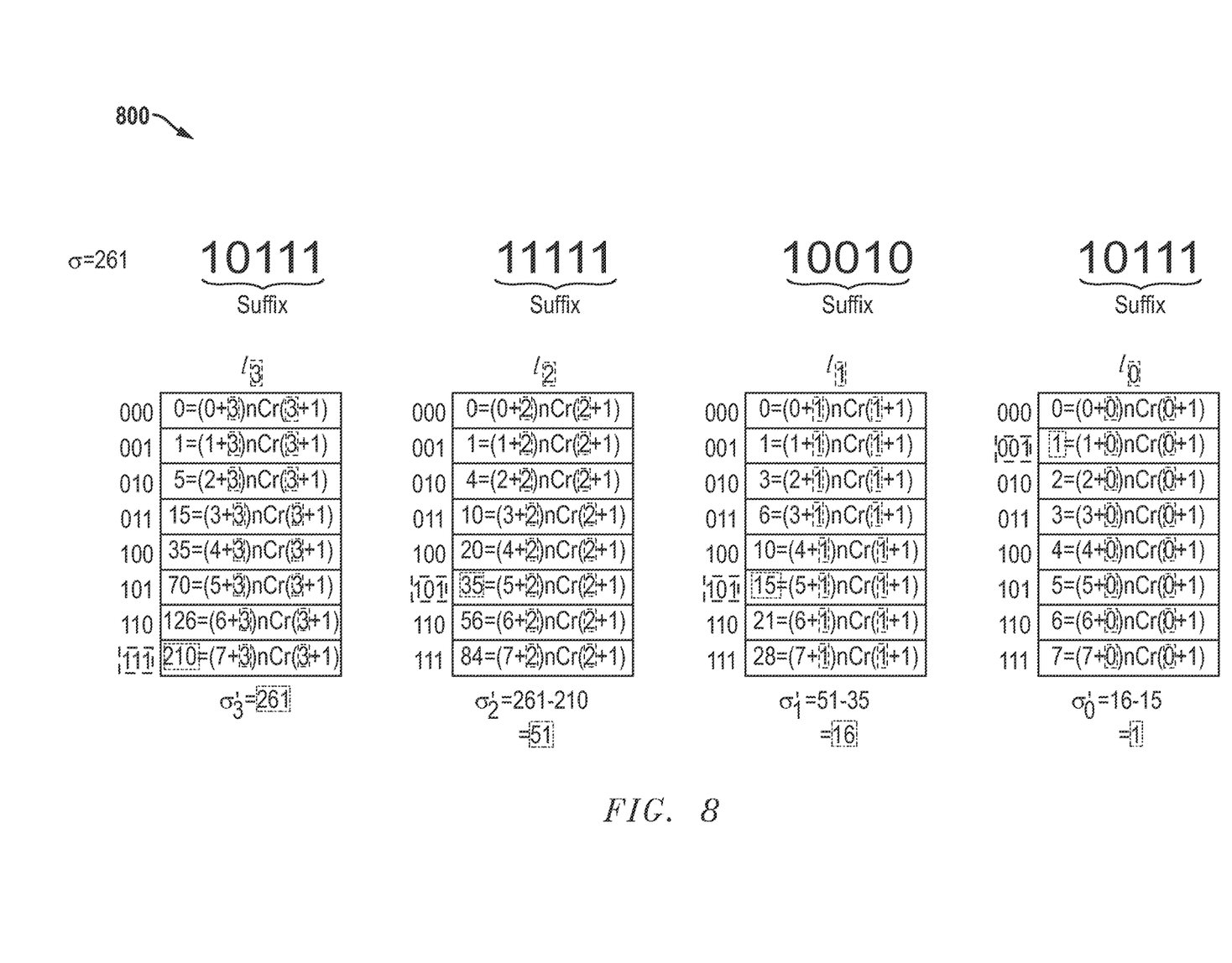
FIG. 8 illustrates in diagram form part of a process using encoding tables to decompress a code word according to some embodiments.
Figure 9:
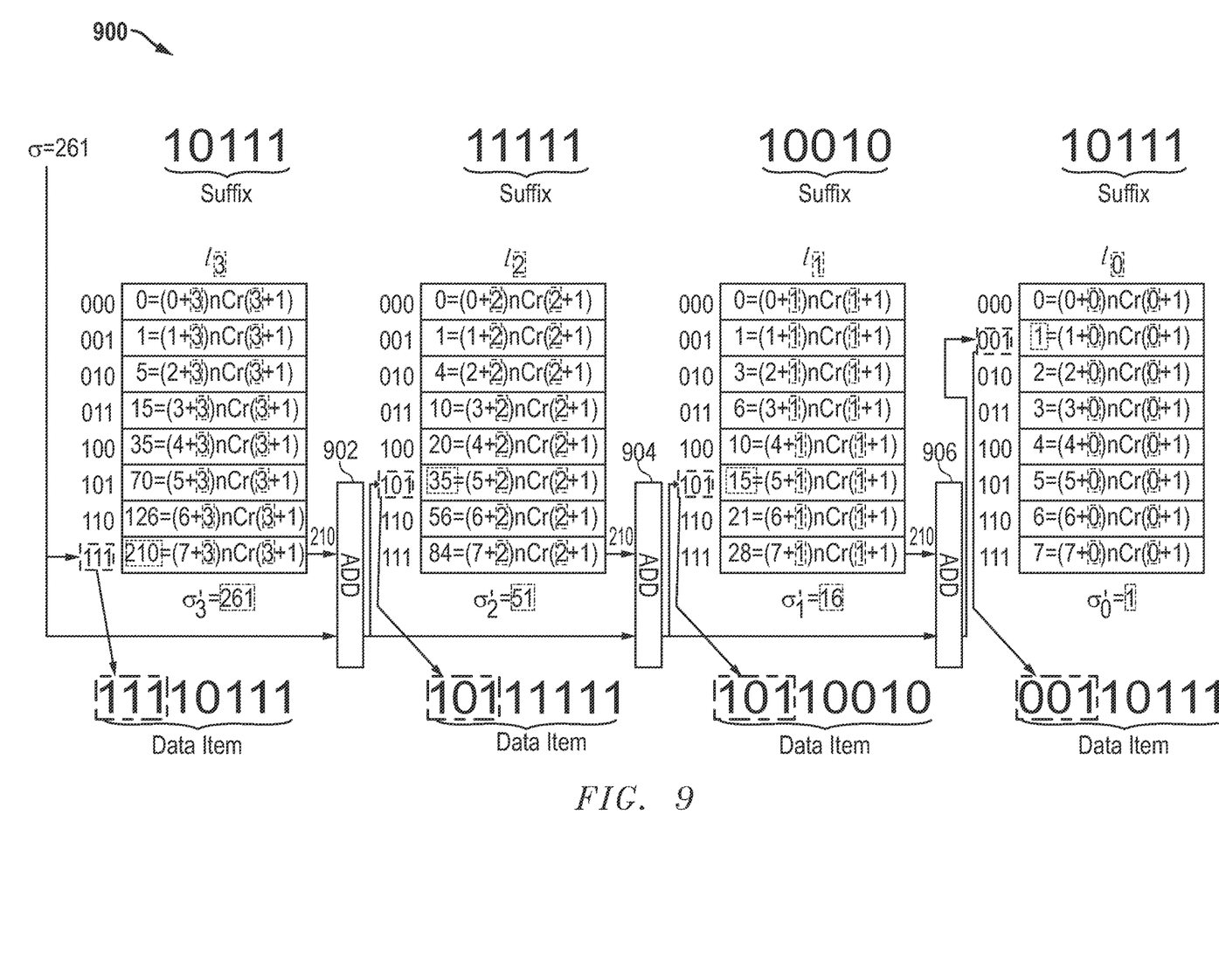
FIG. 9 illustrates in diagram form a further portion of the process of FIG. 8.

FIG. 7 illustrates in flow diagram form a process 700 for decompressing a code word according to some embodiments. FIG. 8 illustrates in diagram form part of a process 800 using encoding tables to decompress a code word according to some embodiments. FIG. 9 is a diagram showing a further portion 900 of the process of FIG. 8. The following description will refer to FIGS. 7-9 as needed. Process 700 may be performed by a software decompression engine 116 (FIG. 1), or other suitable hardware implementation. The depicted decoding process is one example that may be used given the encoding process described above. Others decoding schemes are possible for the encoding used above or other encodings.

At block 702, in response to a requirement to provide data from a set of data items, process 700 retrieves the code word σ for the set of data items from memory and begins decompression. The stored suffixes of the set of data items are retrieved as well, as shown along the top of FIG. 8. The decoding generally starts with the code word σ that is the compressed representation of k, r-bit prefixes, and decodes the prefixes starting from the k-lth prefix down to the 0th prefix. Process 700 incudes k iterations, in this example four, one per prefix. The iterations employ encoding tables $l_3$ to $l_0$, as shown in FIGS. 8 and 9, in the order produced by the semi-sorting. In this embodiment, the tables used are the same encoding tables that were employed in encoding from table $l_{k-1}$ to table $l_0$.

For the first iteration, process 700 at block 704 initializes an integer i to be k−1 and a search value σ' to be equal to the code word σ. Then at block 706, searching encoding table $l_i$ for a largest value that is less than or equal to the search value σ'. This is illustrated in FIG. 8 where table $l_3$ is shown with the search result highlighted from the searching for the highest value less than σ' of 261, which is the value 210 found in the last entry.

This search result is used at block 708, which sets the recovered prefix $p_i$ equal to a table index of the largest value found in the search. In the example of FIG. 9, the recovered prefix is set to the index 111 of the last entry in table $l_3$. The recovered prefix value of 111 is combined with the stored suffix value 10111, in the order provided by the sort used when encoding the code word, providing the complete data item shown under table $l_3$.

Next at block 710, the integer i is set decremented to proceed to the next iteration. At block 712, the search value σ' is set equal to the prior search value σ' minus the largest value found in the prior search iteration that was less than or equal to prior search value σ'. In the example of FIG. 9, this value is shown by the new search value 62 calculated as 261−210=51. The source of the values is shown by the arrows feeding into the addition block 902.

Then at block 714, the encoding table $l_i$ is searched for the largest value that is less than or equal to the new search value σ'. This is shown in FIG. 8 by the highlighted search result in table $l_2$ of 35, the largest table entry less than 51. At block 716, the recovered prefix $p_i$ is set equal to a table index of the largest value found in the search. In the example recovered prefix $p_2$ is set to the highlighted index value 101 for table $l_2$. This prefix is combined with the stored suffix data to provide the complete data item for prefix $p_2$, which is 10111111.

Blocks 710 through 716 are repeated until a final iteration is completed with integer i at zero, which completes the set of recovered prefixes. In the example of FIGS. 8-9, the final two iterations are depicted showing resulting values. Table $l_1$ is searched with a value of $\sigma'_1$ of 16, which equals the prior search value 51 from the prior iteration minus the largest value found, 35. The recovered index $p_i$ is set to the table index value found searching with 16, which is 101, the index of 15 from table $l_1$. Then table $l_0$ is searched with a value of $\sigma_0'$ of 1, which equals the prior search value 16 minus the largest value previously found, 15. The recovered index $p_0$ is set to the table index value found searching with 1, which is 001, the index of the value 1 found in table $l_0$.

Note that while the depicted process 700 shows the prefix recovery or decompression occurring completely, this is not limiting, and the process may be only partially completed if values are only required from prefixes recovered early in the process.

The searches of blocks 706 and 714 may be done in a linear or parallel fashion for small tables or alternatively using another suitable search algorithm such as a modified binary search for larger ones. As discussed above, the process may be implemented with a microprocessor executing program code, with application specific digital logic, or with programmable logic.

FIG. 10 illustrates in chart form an example of compression performance obtained according to some embodiments. Chart 1000 shows performance of the example process described above for multiple data sets, with the reduction in bits per data item on the vertical axis versus the prefix length in bits (r), the number of bits compressed per item, on the horizontal axis. The chart legend identifies the different associativities of the data sets. The term "associativity" is used herein as it is generally used in the art to describe cache sets or similar sets of data. That is, each memory address or other data item identifier maps to a possible number of positions within a set or group of data items. The number of possible positions is the associativity. Note that each power of 2 increase in associativity yields approximately another bit in savings per compressed prefix (assuming an appropriate value for r).

Given a k-item set with r-bit prefixes, the initial space to store those prefixes is kr bits. Such an encoding allows the storage process to encode all $2^{rk}$ permutations of a set of k, r-bit numbers where duplicates are permissible. However, with exactly $2^r$ distinct values per data item, if those values are ordered, the problem evolves from having to store all permutations of k r-bit numbers to only having to store the combinations. There are $$\binom{2^r + k - 1}{k}$$

such combinations, which is much less than the full $2^{rk}$ permutations. Thus, the techniques herein can encode those combinations in $$\left\lceil \log_2 \binom{2^r + k - 1}{k} \right\rceil \text{ bits,}$$

when rounding up to the nearest whole bit. The net savings per set are therefore the net size of k, r-bit numbers (kr bits) minus the new size $$\left\lceil \log_2 \binom{2^r + k - 1}{k} \right\rceil \text{ bits}.$$

Dividing the net savings by the number of items per set (k), we get the savings in bits per compressed prefix (or item for that matter), which is plotted for several examples in FIG. 10 and generally described by Equation 2:

$$\text{Bits saved per r-bit prefix} = \frac{r * k - \left\lceil \log_2 \binom{2^r + k - 1}{k} \right\rceil}{k} \quad (2)$$

As can be understood from chart 1000, for high associativity structures, the storage cost of the prefixes can often be reduced by one to four bits depending on the set associativity. In ASMDSs, where data items are often only eight to a few tens of bits in length, the savings of one to four bits per item are significant. Further, the prefixes only need to be several bits in length to realize the bulk of the benefit of compression. This property is important because the individual encoding lookup tables in the example processes herein each have $2^r$ entries, so a longer prefix is costly in terms of the encoding table size.

Prior work uses one decoding table and one encoding table. If sorting is not performed prior to compression, then the full $2^{rk}$ permutations each need an entry in the encoding table. If sorting by prefix is performed prior to compression, then only a table with $$\binom{2^r + k - 1}{k}$$

entries is necessary. For example, if each entry is 4 bytes in size, then even with r=4 and k=4, there are 3867 entries in the lookup table. With two bytes per item, each table is about 8 KB (16 KB for both).

In contrast, some example implementations herein use k lookup tables, each with $2^r$ entries. With k=4 and r=4, such a design uses at most $k2^r$ entries. At two bytes per entry, the total space cost is 2 bytes*4*2^4=128 bytes. The storage cost of this approach scales roughly linearly with k when r is fixed but diverges from linear behavior because each lookup table entry takes on the order of $$\log_2 \binom{2^r + k - 1}{k} \text{ bits}$$

to encode. Performing the encoding and decoding by computing the lookup table values on the fly further reduces the storage costs. As previously indicated, another available optimization is to make the final lookup table implicit because it is always $$\binom{p_0}{0+1},$$

which is simply $p_0$, so whatever is remaining after k−1 iterations of the decompression process is the last prefix. Similarly, during encoding, the final prefix of the encoding process may be encoded into the code word by adding the zeroth prefix to the integer sum (FIG. 3, 308).

The techniques described herein may be implemented with various combinations of hardware and software. For example, the hardware circuitry may include digital logic, finite state machines, programmable logic arrays (PLAs), and the like. The compression and decompression processes could be implemented with a microcontroller executing stored program instructions to evaluate the relative timing eligibility of the pending commands. In this case some of the instructions may be stored in a non-transitory computer memory or computer readable storage medium for execution by the microcontroller. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The data processing platform 100 of FIG. 1, or any portions thereof, such as processor 110, or other implementations such as customized digital logic implementations, may be described or represented by a computer accessible data structure in the form of a database, database index, or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a dataset describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the type of data in the data sets may vary in different embodiments, such as various types of cache lines, cache tags, fingerprints from ASMDSs, network routing data, hardware tables from branch predictors or hardware prefetchers, or database entries. The mathematical algorithm used to produce the encoding tables may vary. The particular process for encoding and decoding based on the multiple tables may also vary. The method of providing the encoding tables may also vary, including calculation or partial calculation of the table values. Furthermore, while a single code word is employed in the examples herein, other embodiments may produce multiple code words for a particular data set, depending on the compression algorithm employed.

Accordingly, it is intended by the appended claims to cover all modifications of the disclosed embodiments that fall within the scope of the disclosure.

What is claimed is:

1. A data processing platform comprising:
a memory;
a processor coupled to the memory and operable to:
receive a set of data items;
identify a group of bits and remaining data for each respective data item in the set of data items based on data content of the respective data item;
sort the set of data items based on the groups of bits;
encode the groups of bits by querying multiple encoding tables and summing a plurality of integers therefrom to create a code word containing compressed information representing values of all groups of bits for the set of data items;
store the remaining data for each of the data items and the code word in the memory;
decompress the code word to recover the groups of bits; and
pair the recovered groups of bits with their respective remaining data.

2. The data processing platform of claim 1, wherein:
the multiple encoding tables each include a number of indexes; and
querying the multiple encoding tables provides the plurality of integers representing respective indexes for the groups of bits.

3. The data processing platform of claim 2, wherein:
the multiple encoding tables are provided such that, for each group of bits, the respective index provides a count based on a plurality of ordered collections of values for the groups of bits ordered by an ordering property; and
the counts are based on the respective value's relative position in the ordered collections.

4. The data processing platform of claim 3, wherein the count for each respective index indicates a number of ordered collections of values of the groups of bits where each ordered collection's size is an output of a function applied to the values relative position in the ordered collections, and all values in the ordered collections are less than the value of the respective group of bits as computed by the ordering property.

5. The data processing platform of claim 1, wherein the processor is further operable to at least partially compute the multiple encoding tables in response to a requirement to decompress the code word.

6. The data processing platform of claim 1, wherein the multiple encoding tables include a number k of encoding tables $l_0$ to $l_{k-1}$, the encoding tables partially encoding respective ones of k groups of bits.

7. The data processing platform of claim 6, wherein the processor is further operable to:
when creating the code word, access the multiple encoding tables to obtain respective partial values for the expression:

$$\sigma = \sum_{i=0}^{k-1} \binom{p_i + i}{i + 1}$$

where $\sigma$ is the code word and $p_i$ is the value of the ith group of bits in the order provided by the sorting.

8. The data processing platform of claim 7, wherein multiple encoding tables contain group of bits values and indexes that are not arranged in order of the group of bits values.

9. The data processing platform of claim 7, wherein decompressing the code word a comprises performing a number of iterations including:
for a first iteration, initializing a search value to be equal to the code word, setting a recovered group of bits $p_i$ equal to a table index to a largest value in an initial table less than or equal to the search value; and
for subsequent iterations:
updating the search value equal to the prior search value minus the largest value found in the prior iteration; and
setting the recovered group of bits $p_i$ equal to a table index of a largest value in a subsequent table less than or equal to the updated search value.

10. The data processing platform of claim 1, wherein the processor sorts the data items using only the groups of bits.

11. A method of compressing and storing data comprising:
receiving a set of data items;
identifying a group of bits and remaining data for each respective data item in the set of data items based on data content of the respective data item;
sorting the set of data items based on the groups of bits;
encoding the groups of bits by querying multiple encoding tables and summing a plurality of integers therefrom to create a code word containing compressed information representing values of all groups of bits for the set of data items;
storing the remaining data for each of the data items and the code word;
decompressing the code word to recover the groups of bits; and
pairing the recovered groups of bits with their respective remaining data.

12. The method of claim 11, wherein:
the multiple encoding tables each include a number of positions for the groups of bits, and wherein querying the multiple encoding tables provides the plurality of integers representing respective positions for the groups of bits.

13. The method of claim 12, wherein the multiple encoding tables are provided such that, for each group of bits, the respective index provides a count based on a plurality of ordered collections of values for the groups of bits ordered by an ordering property, wherein the counts are based on the respective values' relative position in the ordered collections.

14. The method of claim 13, wherein the count for each respective index indicates a number of ordered collections of values for the groups of bits where each ordered collection's size is an output of a function applied to the values' relative position in the ordered collections, and all values in the ordered collections are less than the value of the respective group of bits as computed by the ordering property.

15. The method of claim 11, wherein the multiple encoding tables include a number k of encoding tables $l_0$ to $l_{k-i}$, the encoding tables partially encoding respective ones of k groups of bits, the method further comprising:
when creating the code word, access the multiple encoding tables to obtain respective partial values for the expression:

$$\sigma = \sum_{i=0}^{k-1} \binom{p_i + i}{i + 1}$$

where a is the code word and $p_i$ is the value of the ith group of bits in the order provided by the group of bits sorting.

16. The method of claim 15, wherein decompressing the code word a comprises performing a number of iterations including:
for a first iteration, initializing a search value to be equal to the code word, setting a recovered group of bits $p_i$ equal to a table index to a largest value in an initial one of the encoding tables less than or equal to the search value; and
for subsequent iterations:
updating the search value equal to the prior search value minus the largest value found in the prior iteration; and
setting the recovered group of bits $p_i$ equal to a table index of a largest value in a subsequent one of the encoding table less than or equal to the updated search value.

17. The method of claim 11, wherein sorting the data items based on the groups of bits comprises sort the data items using only the groups of bits.

18. A data processing platform comprising:
a memory; and
a processor coupled to the memory and operable to receive a compressed set of data items including a compressed code word and a remaining data for each data item, and decompress the set of data items using a number k of encoding tables, the encoding tables partially encoding respective ones of k groups of bits, wherein the decompression includes performing a number of iterations including:
for a first iteration, initializing a search value to be equal to the code word, setting a recovered group of bits $p_i$ equal to a table index to a largest value in an initial one of the encoding tables less than or equal to the search value; and
for subsequent iterations:
updating the search value equal to the prior search value minus the largest value found in the prior iteration; and
setting the recovered group of bits $p_i$ equal to a table index of a largest value in a subsequent one of the encoding table less than or equal to the updated search value.

19. The data processing platform of claim 18, wherein:
the process further operable to compress the data items by:
identifying the group of bits and remaining data for each respective data item in the set of data items based on data content of the respective data item;
sorting the set of data items based on the groups of bits;
encoding the groups of bits by querying multiple encoding tables and summing a plurality of integers therefrom to create a code word containing compressed information representing values of all groups of bits for the set of data items; and
storing the remaining data for each of the data items and the code word in the memory.

20. The data processing platform of claim 19, wherein:
the multiple encoding tables each include a number of indexes; and
querying the multiple encoding tables provides the plurality of integers representing respective indexes for the groups of bits.

* * * * *